(12) United States Patent
Mikami

(10) Patent No.: US 10,290,510 B2
(45) Date of Patent: May 14, 2019

(54) PLASMA ETCHING METHOD, PATTERN FORMING METHOD AND CLEANING METHOD

(71) Applicant: Tokyo Electron Limited, Tokyo (JP)

(72) Inventor: Shunichi Mikami, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/090,971

(22) Filed: Apr. 5, 2016

(65) Prior Publication Data

US 2016/0300728 A1    Oct. 13, 2016

(30) Foreign Application Priority Data

Apr. 10, 2015  (JP) ................................. 2015-081019

(51) Int. Cl.

| | |
|---|---|
| *H01L 21/02* | (2006.01) |
| *H01L 21/3065* | (2006.01) |
| *H01L 21/3213* | (2006.01) |
| *H01L 21/311* | (2006.01) |
| *H01C 17/00* | (2006.01) |
| *H01C 17/24* | (2006.01) |

(52) U.S. Cl.
CPC ...... *H01L 21/31122* (2013.01); *H01C 17/003* (2013.01); *H01C 17/2416* (2013.01); *H01L 21/0234* (2013.01); *H01L 21/02334* (2013.01); *H01L 21/3065* (2013.01); *H01L 21/311* (2013.01); *H01L 21/31144* (2013.01); *H01L 21/32136* (2013.01); *H01L 21/32137* (2013.01)

(58) Field of Classification Search
None
See application file for complete search history.

(56) References Cited

U.S. PATENT DOCUMENTS

| | | | | |
|---|---|---|---|---|
| 6,014,979 | A * | 1/2000 | Van Autryve | B08B 7/0035 134/1.1 |
| 6,379,575 | B1* | 4/2002 | Yin | B08B 7/0035 134/1.1 |
| 2002/0195416 | A1* | 12/2002 | Nallan | H01L 21/32136 216/2 |
| 2004/0129671 | A1* | 7/2004 | Ji | B08B 7/00 216/58 |
| 2005/0164479 | A1* | 7/2005 | Perng | H01L 21/28194 438/591 |

(Continued)

FOREIGN PATENT DOCUMENTS

| | | |
|---|---|---|
| JP | 2004-146787 | 5/2004 |
| JP | 2005-252186 | 9/2005 |
| JP | 2015-041624 | 3/2015 |

*Primary Examiner* — Stephanie P Duclair
(74) *Attorney, Agent, or Firm* — IPUSA, PLLC

(57) ABSTRACT

A plasma etching method is performed by forming a desired pattern of a mask into a film including a zirconium oxide film by plasma etching with plasma generated from a first gas. The first gas consists of at least one chloride-containing gas of the group of boron trichloride, tetrachloromethane, chloride and silicon tetrachloride, at least one hydrogen-containing gas of the group of hydrogen bromide, hydrogen and methane, and a noble gas. An underlying film of a silicon oxide film or an amorphous carbon film is provided underneath the zirconium oxide film, and an etching selectivity of the zirconium oxide film to the underlying film is greater than or equal to one.

13 Claims, 9 Drawing Sheets

(56) References Cited

U.S. PATENT DOCUMENTS

| | | | |
|---|---|---|---|
| 2005/0164511 A1* | 7/2005 | Chen | H01L 21/31122 438/706 |
| 2007/0056925 A1* | 3/2007 | Liu | H01L 21/31116 216/67 |
| 2011/0124134 A1* | 5/2011 | Lin | H01L 21/28008 438/14 |
| 2012/0244693 A1* | 9/2012 | Luong | H01L 21/28247 438/591 |

* cited by examiner

PATTERN FORMATION
(PLASMA ETCHING)
PROCESS

PLASMA ETCHING
PROCESS

PLASMA ETCHING METHOD, PATTERN FORMING METHOD AND CLEANING METHOD

CROSS-REFERENCE TO RELATED APPLICATIONS

This patent application is based upon and claims the benefit of priority of Japanese Patent Application No. 2015-81019, filed on Apr. 10, 2015, the entire contents of which are incorporated herein by reference.

BACKGROUND OF THE INVENTION

1. Field of the Invention

The present invention relates to a plasma etching method, a pattern forming method and a cleaning method.

2. Description of the Related Art

A technique is known of finely processing a target film to be etched by a plasma etching by generating plasma from a gas. For example, Japanese Laid-Open Patent Application Publication No. 2005-252186 discloses a technique of depositing a silicon oxide film on a substrate by a thermal oxidation process first, then depositing a high-k (high-dielectric-constant) film on the silicon oxide film by CVD (Chemical Vapor Deposition), and etching the high-k film by using plasma generated from a gas such as $Cl_2$. Also, Japanese Laid-Open Patent Application Publication No. 2004-146787 discloses a technique of etching a high-k film by using plasma generated from a gas such as $BCl_3$.

Moreover, in recent years, an etching technique is demanded that forms deep holes and trenches into a specific target film to be etched, such as a silicon oxide film and an amorphous carbon film, by a plasma etching.

However, when etching selectivity of the target film to be etched, such as the high-k film, to an underlying film cannot be sufficiently obtained, forming the deep and vertical holes and trenches into the target film to be etched becomes difficult, and the etching properties become worse.

SUMMARY OF THE INVENTION

Accordingly, in response to the above discussed problems, embodiments of the present invention aim to provide a method of etching a film that includes a film having a preferable etching selectivity to a specific target film that is etched using plasma.

According to one embodiment of the present invention, there is provided a plasma etching method that forms a desired pattern of a mask into a film including a zirconium oxide film by plasma etching with plasma generated from a first gas. The first gas consists of at least one chloride-containing gas of the group of boron trichloride, tetrachloromethane, chloride and silicon tetrachloride, at least one hydrogen-containing gas of the group of hydrogen bromide, hydrogen and methane, and a noble gas. An underlying film of a silicon oxide film or an amorphous carbon film is provided underneath the zirconium oxide film, and an etching selectivity of the zirconium oxide film to the underlying film is greater than or equal to 1.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are simply illustrative examples and are not restrictive of the invention as claimed.

DETAILED DESCRIPTION OF THE PREFERRED EMBODIMENTS

Figure 1:
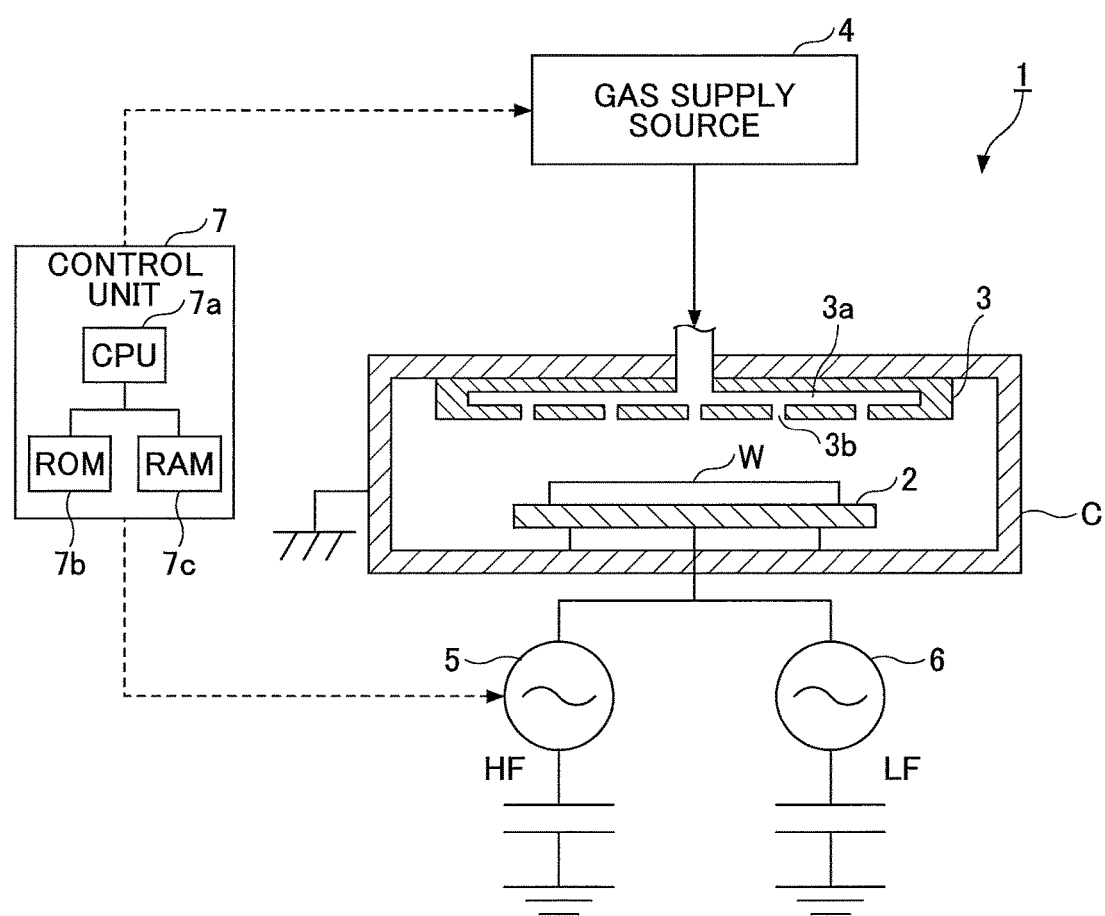
FIG. 1 is a vertical cross-sectional view of a schematic configuration of a plasma etching apparatus used for an embodiment of the present invention.

A description is given below of embodiments of the present invention, with reference to accompanying drawings. Note that elements having substantially the same functions or features maybe given the same reference numerals and overlapping descriptions thereof may be omitted. With respect to s pressure value, 1 Torr can be converted into 133.322 Pa.

[Overall Configuration of Plasma Etching Apparatus]

First, a description is given below of the overall configuration of an embodiment of the plasma processing apparatus 1 according to the present invention, with reference to FIG. 1. FIG. 1 depicts the overall configuration of the plasma etching apparatus used for the embodiment of the present invention.

The plasma etching apparatus 1 includes a cylindrical chamber, for example, made of a metal, such as aluminum or stainless steel (which is hereinafter referred to as a chamber C). The chamber C is grounded. In the chamber C, a plasma etching process is performed on a semiconductor wafer (which is hereinafter referred to as a wafer W).

The chamber C (process chamber) includes a pedestal 2 to receive a wafer W thereon. The pedestal 2 also functions as a lower electrode. An upper electrode 3 is disposed facing the pedestal 2 in a ceiling surface of the chamber. A gas supply source is connected to the upper electrode 3. A diffusion chamber 3a is formed inside the upper electrode 3a to diffuse a gas from the gas supply source 4. The gas in the diffusion chamber 3a is introduced into the chamber C through many gas holes 3b provided in a bottom part of the upper electrode 3. The upper electrode 3 also functions as a shower head to supply a gas.

The plasma etching apparatus 1 is provided with a first high frequency power source 5 and a second high frequency power source 6. High frequency power for plasma generation output from the first high frequency power source 5 is supplied to the pedestal 2 (lower electrode). Here, the high frequency power from the first high frequency power source 5 may be supplied to the lower electrode or the upper electrode. High frequency power for bias output from the second high frequency power source 6 is supplied to the pedestal 2.

The gas introduced into the chamber C is converted to plasma by the supplied high frequency power. This causes a plasma process such as plasma etching and cleaning to be performed on the wafer W in the chamber C. A plasma etching method, a pattern forming method and a cleaning method according to the embodiments can be performed by using the plasma etching apparatus having such a configuration.

The plasma processing apparatus 1 is configured to perform a plasma process in accordance with control of a control unit 7. The control unit 7 includes a CPU (Central Processing Unit) 7a, a ROM (Read Only Memory) 7b, a RAM (Random Access Memory) 7c and the like. The CPU 7a executes the plasma process according to a variety of recipes stored in a storage area of the ROM 7b or the RAM 7c. The recipe specifies process time, temperatures in a process chamber (an upper electrode temperature, a side wall temperature of the process chamber, an electrostatic chuck temperature and the like), a pressure (exhaust gas pressure), high frequency power and a voltage, various process flow rates, a heat transfer flow rate and the like that constitute control information of the plasma etching apparatus 1 depending on process conditions.

As discussed above, the configuration of the plasma etching apparatus 1 according to the embodiment has been described. Next, a mask material used when the plasma etching apparatus 1 performs plasma etching on a wafer W will be described below.

[Zirconium Oxide Film]

When etching a silicon oxide film or an amorphous carbon film, a poly-silicon film (Poly-Si) is generally used as the mask material. However, when the poly-silicon film is used as the mask material, the sufficient selectivity of the poly-silicon film to the silicon oxide film or the like cannot be achieved in the etching. When the selectivity cannot be sufficiently obtained, it is difficult to form deep, vertical holes in the silicon oxide film.

Therefore, in the plasma etching method according to the embodiment, a zirconium oxide film (ZrO) is used as the mask material for the silicon oxide film or the amorphous carbon film that is a target film to be etched.

In the plasma etching method according to the embodiment, a wafer W having the silicon oxide film or the amorphous carbon film deposited thereon and the zirconium oxide film functioning as the mask further stacked thereon is etched by using the plasma. In the embodiment, by citing an example in which an underlying film of the zirconium oxide film (ZrO) is a silicon oxide film or an amorphous silicon oxide film, a plasma etching method having the etching selectivity of the zirconium oxide film for the underlying film of more than or equal to one is proposed.

Optimization of a gas when forming a desired pattern by the plasma etching into the zirconium oxide film on the wafer W having such a configuration is described below.

[Gas Species for Zirconium Oxide Film]

In a pattern forming method according to the embodiment (plasma etching method according to the embodiment), plasma is generated from a gas, and a film including the zirconium oxide film is etched with the plasma by using a first mask in which a desired pattern is formed (e.g., photoresist film). Thus, the patterned zirconium oxide film is used as the mask material to etch the silicon oxide film or the amorphous carbon film with the plasma.

Gas species appropriate for forming the desired pattern into the zirconium oxide film used in the pattern forming method according to the embodiment were identified in experiments. In the following experiments, the plasma etching apparatus 1 of FIG. 1 was used.

(Experiment 1. Gas Species for Zirconium Oxide Film: Single Gas)

Figure 2:
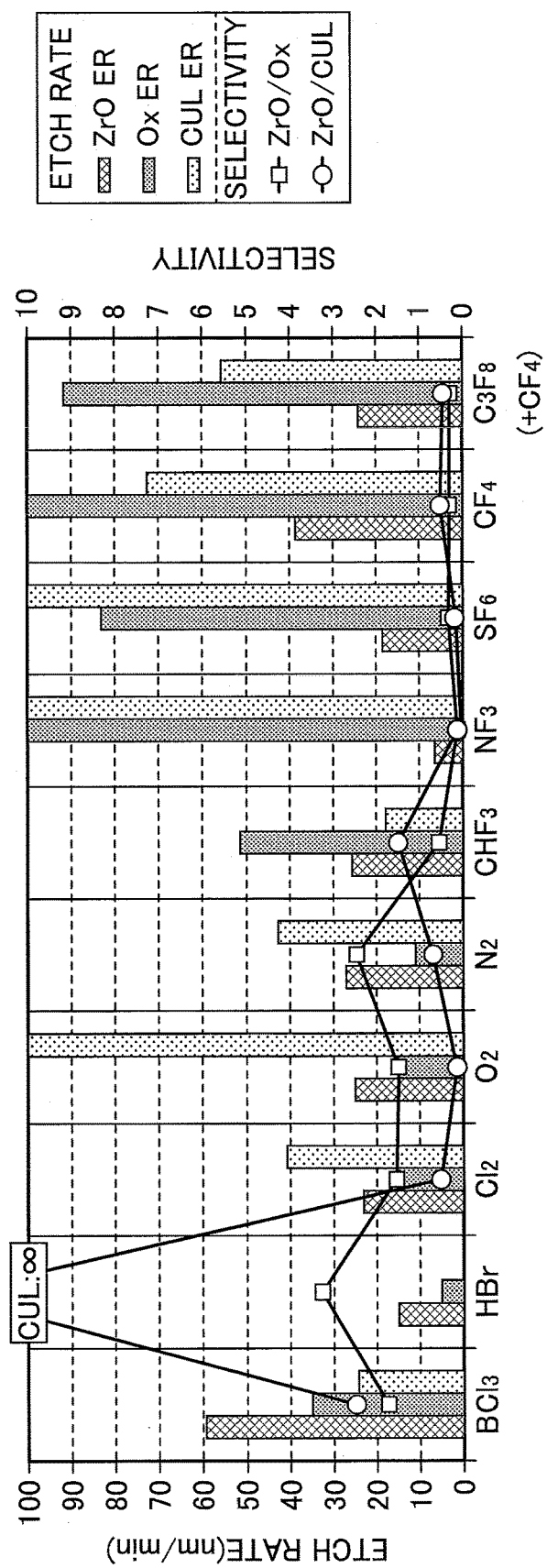
FIG. 2 presents experimental results of the etching rate and selectivity of a zirconium oxide film to an underlying film (Ox/CUL) depending on a gas species according to an embodiment of the present invention.

FIG. 2 shows an experimental result of an etching rate (ETCH RATE) and selectivity (SELECTIVITY) when performing the plasma etching on a zirconium oxide film (ZrO), a silicon oxide film ($SiO_2$) and an amorphous carbon film ($\alpha$-C) when using a plurality of gas species.

In FIG. 2, and FIGS. 3 through 7 described later, a silicon oxide film of an example of a target film to be etched is expressed as an "Ox," and an amorphous carbon film of another example of a target film to be etched is expressed as a "CUL." Also, a "ZrO ER", an "Ox ER" and a "CUR ER" express etching rates of the zirconium oxide film, the silicon oxide film and the amorphous carbon film, respectively. Moreover, a "ZrO/Ox" expresses selectivity of the zirconium oxide film to the silicon oxide film (which is hereinafter referred to as the selectivity "ZrO/Ox"). A "ZrO/CUL" expresses selectivity of the zirconium oxide film to the amorphous carbon film (which is hereinafter referred to as the selectivity "ZrO/CUL").

Bar graphs along the vertical axis express etching rate of the zirconium oxide film "ZrO ER", the etching rate of the silicon oxide film "Ox ER" and the etching rate of the amorphous carbon film "CUL ER" to a plurality of gas species shown in the horizontal axis. Line graphs' values in the vertical axis express the selectivity "ZrO/Ox" and the selectivity "ZrO/CUL" to the plurality of gas species shown in the horizontal axis.

The pattern forming method according to the embodiment is used in a process of forming a pattern into the zirconium oxide film by using the first mask. Hence, in the pattern forming process, it is preferable not to etch the silicon oxide film or the amorphous carbon film that is the underlying film of the zirconium oxide film. In other words, it is preferable that the selectivity "ZrO/Ox" and the selectivity "ZrO/CUL" are high.

In the experimental result of FIG. 2, gases having both of the selectivity "ZrO/Ox" and the selectivity "ZrO/CUL" higher than or equal to 1 were boron trichloride ($BCl_3$) and hydrogen bromide (HBr). In particular, when performing the etching by using plasma generated from hydrogen bromide (HBr) gas, the selectivity "ZrO/CUL" was infinite. In other words, this result meant that the plasma etching using hydrogen bromide (HBr) did not etch the amorphous carbon film at all during etching of the zirconium oxide film.

Accordingly, the experimental results indicated that the gas species appropriate for forming a desired pattern into the zirconium oxide film were boron trichloride ($BCl_3$) and hydrogen bromide (HBr) in the pattern forming method according to the embodiment.

(Experiment 2. Gas Species for Zirconium Oxide Film: Ratio between $BCl_3$ and HBr)

Figure 3:
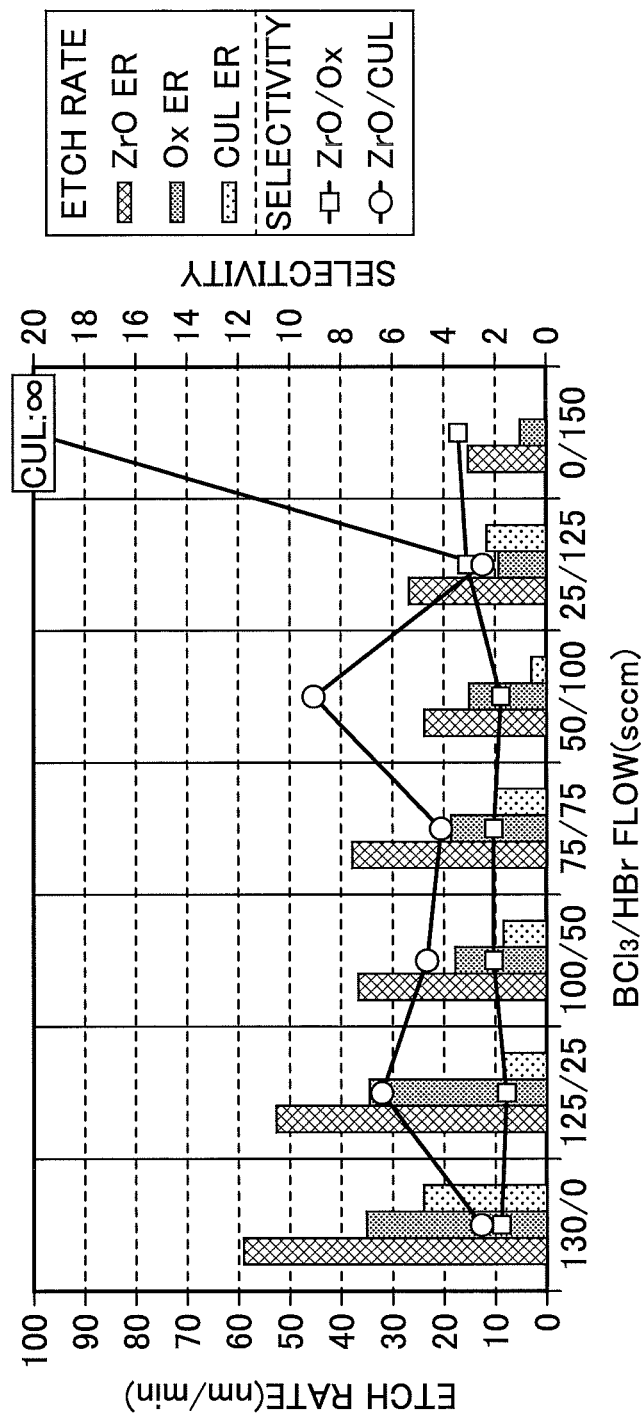
FIG. 3 presents experimental results of the etching rate and selectivity of a zirconium oxide film to an underlying film (Ox/CUL) depending on a ratio between $BCl_3$ and HBr according to an embodiment of the present invention.

Next, a plasma etching process in which the ration between boron trichloride ($BCl_3$) and hydrogen bromide (HBr) is changed was evaluated. The experimental results are shown in FIG. 3. The ratio between two of the gases is shown in the horizontal axis, and the etching rate is shown in the vertical axis. The ratio of hydrogen bromide (HBr) to boron trichloride ($BCl_3$) increases toward the right side of the graph.

The results indicated that the selectivity "ZrO/Ox" and the selectivity "ZrO/CUL" were likely to increase as the ratio of hydrogen bromide (HBr) to boron trichloride ($BCl_3$) increased. Moreover, the result indicated that the etching rate "ZrO ER" of the zirconium oxide film depended on the flow rate of boron trichloride ($BCl_3$) and increased as the flow rate of boron trichloride ($BCl_3$) increased. The flow rate of boron trichloride ($BCl_3$) to hydrogen bromide (HBr) was preferably 50% or lower. In particular, when the flow rate of boron trichloride ($BCl_3$) to hydrogen bromide (HBr) is "25/125", the etching rate of zirconium oxide film "ZrO ER" was higher than or equal to a permissible value (threshold value), and both of the selectivity "ZrO/Ox" and the selectivity "ZrO/CUL" were high, which was preferable.

As discussed above, the result indicated that improvement of the selectivity "ZrO/Ox" and the selectivity "ZrO/CUL" depends on whether or not the plasma gas contains hydrogen. Furthermore, the result indicated that boron trichloride ($BCl_3$) was needed to maintain or improve the etching rate. Hence, considering both of the etching rate and the selectivity, it is noted that using a mixed gas obtained by adding a hydrogen (H) component to boron trichloride ($BCl_3$) is preferable in the pattern forming method according to the embodiment.

(Experiment 3. Gas Species for Zirconium Oxide Film: Proportion of $BCl_3$, HBr and $H_2$)

Figure 4:
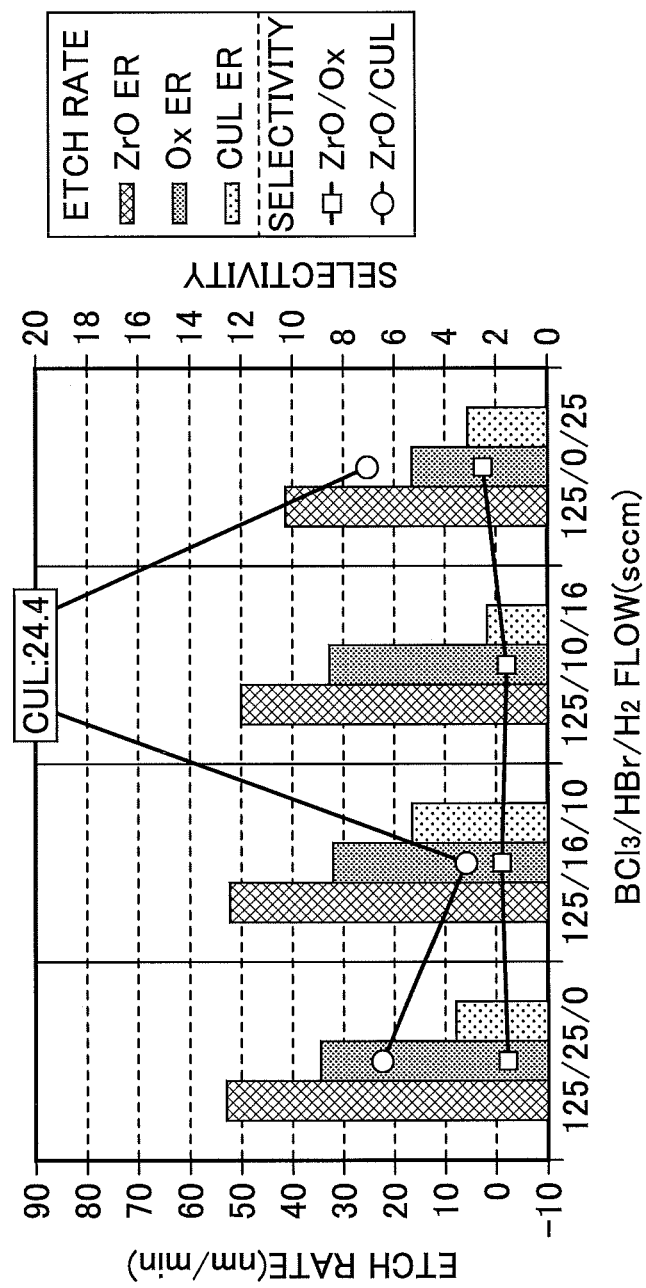
FIG. 4 presents experimental results of the etching rate and selectivity of a zirconium oxide film to an underlying film (Ox/CUL) depending on a ratio between HBr and $H_2$ according to an embodiment of the present invention.
Figure 5:
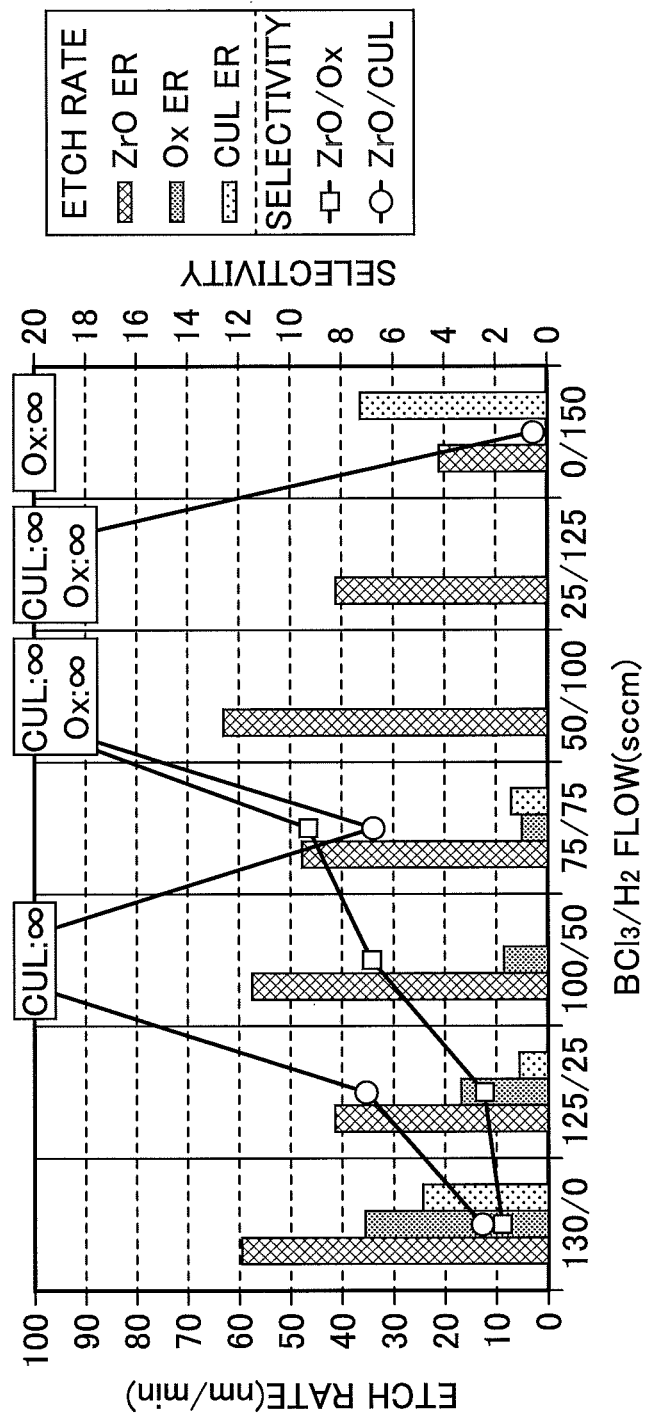
FIG. 5 presents experimental results of the etching rate and selectivity of a zirconium oxide film to an underlying film (Ox/CUL) depending on a ratio between $BCl_3$ and $H_2$ according to an embodiment of the present invention.

Next, a plasma etching process in which the ratio between hydrogen bromide (HBr) and hydrogen ($H_2$) is varied, while the flow rate of boron trichloride ($BCl_3$) is fixed, was evaluated. FIG. 4 shows the experimental results. In the experiment, the plasma etching process was performed by changing the ratio between hydrogen bromide (HBr) and hydrogen ($H_2$) while setting the flow rate of boron trichloride ($BCl_3$) at "125 sccm." A proportion of three of the gases is shown in the horizontal axis, and an etching rate is shown in the vertical axis. The ratio of hydrogen ($H_2$) to hydrogen bromide (HBr) increases toward the right side of the graph.

The results indicated that the selectivity "ZrO/Ox" and the selectivity "ZrO/CUL" basically increased when hydrogen bromide (HBr) was displaced by hydrogen ($H_2$) in this manner. In particular, the selectivity "ZrO/Ox" increased as hydrogen bromide (HBr) was displaced by hydrogen ($H_2$) more and more. In other words, the result indicated that the selectivity "ZrO/Ox" and the selectivity "ZrO/CUL" increased when the partial pressure of hydrogen ($H_2$) among the mixed gas was increased.

(Experiment 4. Gas Species for Zirconium Oxide Film: Ratio Between $BCl_3$ and $H_2$)

Subsequently, a plasma etching process in which the ratio between $BCl_3$ and $H_2$ are varied was evaluated. In the experimental result, a ratio of hydrogen ($H_2$) to boron trichloride ($BCl_3$) becomes higher toward the right side of the graph.

As a result of this, both of the selectivity "ZrO/Ox" and the selectivity "ZrO/CUL" were preferable when the flow rates of boron trichloride ($BCl_3$) and hydrogen ($H_2$) were "130/0" through "25/125" (sccm, both). In other words, it is preferable to have the flow rate of boron trichloride ($BCl_3$) be lower than the flow rate of hydrogen ($H_2$).

In particular, when the flow rates of boron trichloride $BCl_3$ and hydrogen ($H_2$) were "50/100" and "25/125" (sccm, both), both of the selectivity "ZrO/Ox" and the selectivity "ZrO/CUL" became infinite, which were the most preferable. In other words, when the flow rates of boron trichloride ($BCl_3$) and hydrogen ($H_2$) were "50/100" and "25/125" (sccm, both), only the zirconium oxide film could be etched without etching the silicon oxide film and the amorphous carbon film of the underlying film.

From the results discussed above, in the pattern forming method according to the embodiment, plasma is generated from a gas containing boron trichloride (BCl3) and hydrogen (H2), and a film including a zirconium oxide film is etched with plasma by using a first mask (e.g., photoresist film) in which a pattern is formed. This allows the formation of a desired pattern in the ZrO film, which may then be used as a mask material when etching a silicon oxide film and an amorphous carbon film by using plasma. This enables the plasma etching to be performed preferably.

A silicon oxide film, an amorphous carbon film or a spin-on carbon film may be used as the first mask when etching the zirconium oxide film instead of the photoresist film. In this case, the flow rates of boron trichloride ($BCl_3$) and hydrogen ($H_2$) may be set at any of "130/0", "125/25", "100/50", "75/75", "50/100", and "25/125" (sccm, in any). Among the settings, when the flow rates of boron trichloride ($BCl_3$) and hydrogen ($H_2$) are set at "50/100" or "25/125" (sccm, both), the selectivity "ZrO/Ox" and the selectivity "ZrO/CUL" can be made infinite, which are the most preferable.

(Experiment 5. Gas Species for Zirconium Oxide Film: Ar Gas Added)

Figure 6:
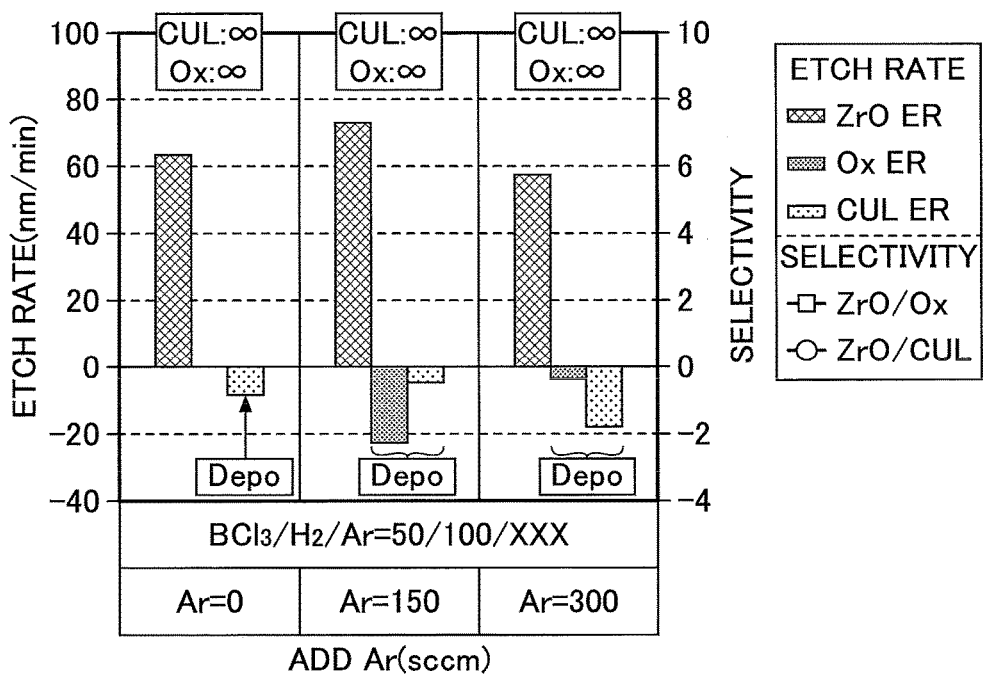
FIG. 6 presents experimental result of the etching rate and selectivity of a zirconium oxide film to an underlying film (Ox/CUL) when adding Ar to $BCl_3$ and $H_2$ according to an embodiment of the present invention.

Next, a plasma etching process was performed by adding Ar gas to the mixed gas of boron trichloride ($BCl_3$) and hydrogen ($H_2$) as an example of a noble gas while changing a flow rate of argon (Ar) gas. FIG. 6 shows the experimental result.

In this experiment, the flow rate of argon (Ar) was changed to "0", "150", and "300" (sccm, in any) while the flow rates of boron trichloride ($BCl_3$) and hydrogen ($H_2$) were set at "50 sccm" and "100 sccm", respectively. The results indicated that an etching rate of the zirconium oxide film "ZrO ER" increased when argon (Ar) gas was added at a flow rate of 150 sccm than when argon (Ar) gas was not added. Moreover, the selectivity "ZrO/Ox" and the selectivity "ZrO/CUL" did not change but were infinite whether argon (Ar) gas was added or not. Thus, the results indicated that the etching rate of the zirconium oxide film "ZrO ER" improved and the selectivity "ZrO/Ox" and the selectivity "ZrO/CUL" were maintained in the best conditions when argon (Ar) gas was added.

(Experiment 6. Gas Species for Zirconium Oxide Film: He Gas Added)

Figure 7:
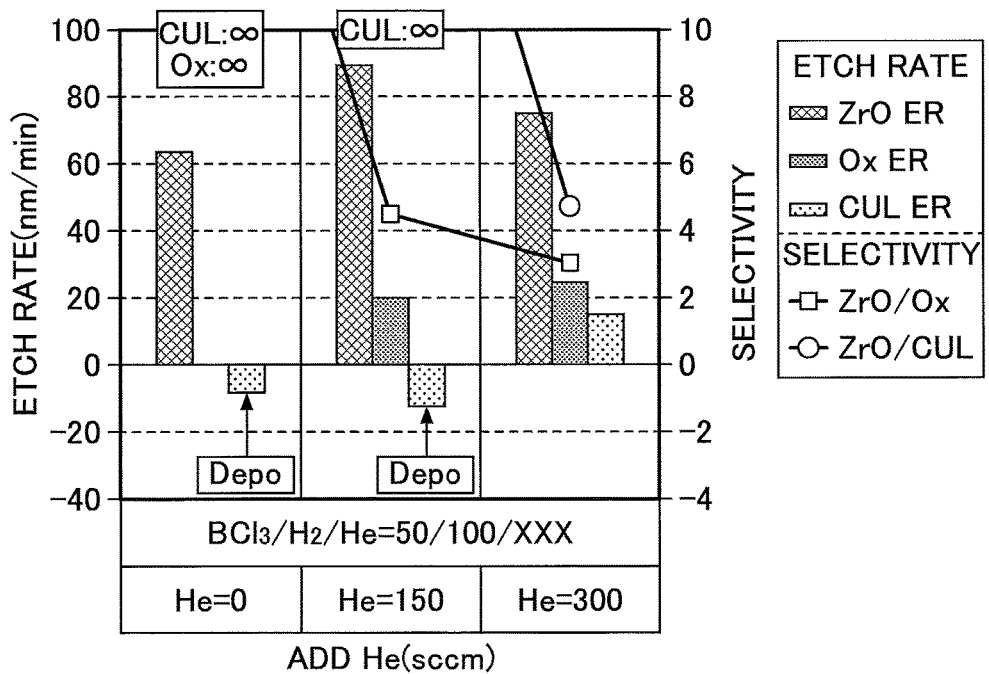
FIG. 7 presents experimental result of the etching rate and selectivity of a zirconium oxide film to an underlying film (Ox/CUL) when adding He to $BCl_3$ and $H_2$ according to an embodiment of the present invention.

A similar investigation in which helium was used as the noble gas was conducted. More specifically, a plasma etching process was performed by adding helium gas to boron trichloride and hydrogen while changing the flow rate of helium. FIG. 7 shows the experimental result.

In this experiment, the flow rate of helium (He) was changed to "0", "150", and "300" (sccm, in any) while the flow rates of boron trichloride ($301_3$) and hydrogen ($H_2$)

were set at "50 sccm" and "100 sccm", respectively. The result indicated that an etching rate of the zirconium oxide film "ZrO ER" increased when helium gas was added at a flow rate of 150 sccm or 300 sccm than when helium (He) gas was not added. On the other hand, the result indicated that the selectivity "ZrO/Ox" and the selectivity "ZrO/CUL" became infinite when helium (He) gas was not added, which was better than when helium (He) gas was added, but that the selectivity "ZrO/Ox" and the selectivity "ZrO/CUL" that were higher than or equal to a permissible value could be obtained regardless of whether helium (He) gas was added or not.

As discussed above, the experimental results have indicated that the etching rate of the zirconium oxide film "ZrO ER" and the throughput of the process can be improved while maintaining desired selectivity by adding a noble gas such as argon (Ar) gas or helium (He) gas to the mixed gas of boron trichloride ($BCl_3$) and hydrogen ($H_2$).

Thus, in the pattern forming method according to the embodiment, the experimental results for identifying appropriate gas species when forming a desired pattern into the zirconium oxide film have been described. The experiments have indicated that the etching rate of the zirconium oxide film "ZrO ER" can be increased, and the selectivity of the zirconium oxide film to the silicon oxide film or the amorphous carbon film of the underlying film can be improved by etching the zirconium oxide film by using the plasma generated from the mixed gas of boron trichloride ($BCl_3$) and hydrogen ($H_2$)

Based on the experimental results, the etching rate of the zirconium oxide film "ZrO ER" can be improved by a chloride (Cl) component contained in boron trichloride ($BCl_3$) among the introduced gas. Moreover, the selectivity of the zirconium oxide film to the silicon oxide film or the amorphous carbon film (the selectivity "ZrO/Ox" and the selectivity "ZrO/CUL") of the underlying film can be improved by increasing the partial pressure of hydrogen H contained in the introduced gas. Here, even when the underlying film is a spin-on carbon film, the selectivity of the zirconium oxide film to the spin-on carbon film can be improved as well as the underlying film of the amorphous carbon film.

Thus, the pattern forming method according to the embodiments including the process of introducing the first gas, etching the film containing the zirconium oxide film by using the first mask in which a pattern is formed by using the plasma generated from the first gas, and forming a pattern into the zirconium oxide film, has been described hereinabove. In addition, the optimization of the first gas used in the pattern forming method has been described.

In the above experiments, boron trichloride ($BCl_3$) was used as one of the gas contained in the first gas. However, the gas contained in the first gas is not limited to boron trichloride ($BCl_3$). The first gas just has to contain at least a halogen-containing gas. The halogen-containing gas has a function of etching the zirconium oxide film. As an examples of the halogen containing gas, at least one of trichloride ($BCl_3$), carbon tetrachloride ($CCl_4$), chloride ($Cl_2$), and silicon tetrachloride ($SiCl_4$) can be included. A bromine-containing gas or a fluoride-containing gas can be included as another example of the halogen-containing gas.

For example, in the above experiments, the first gas contains boron trichloride ($BCl_3$) or hydrogen bromide (HBr). The gas contained in the first gas is not limited to boron trichloride ($BCl_3$) or hydrogen bromide (HBr), but just has to be or produce a hydrogen-containing gas. The hydrogen-containing gas improves the selectivity when etching the zirconium oxide film. As examples of the hydrogen-containing gas, at least one of hydrogen bromide (HBr), hydrogen (H2) and methane $CH_4$ may be included.

Furthermore, the first gas may contain a noble gas in addition to the halogen gas in order to further increase the etching rate of the zirconium oxide film. The noble gas may contain at least one of argon (Ar) gas and Helium (He) gas.

The first mask used when performing the plasma etching on the zirconium oxide film by using the first gas may be a photoresist mask, a silicon oxide film or an amorphous carbon film.

Process conditions of the experiments 1 through 6 were the following.
Pressure: 20 mT;
First High Frequency Power: 500 W;
First High Frequency Power: 500 W;
Temperature of Pedestal: 30 degrees C.; and
Etching Time: 30 seconds.

[Plasma Etching Method]

In the above-described pattern forming method according to the embodiment, a pattern was formed in the zirconium oxide film by using the plasma generated from the gas containing the halogen-containing gas. The patterned zirconium oxide film is appropriate for a mask used for etching the silicon oxide film or the amorphous carbon film of the underlying film. By using the zirconium oxide film as a mask material, the mask selectivity can be improved, and a deep and vertical hole can be formed in the silicon oxide film or the like. A plasma etching method including a pattern forming process of the zirconium oxide film according to an embodiment of the present invention, will be described below with reference to FIGS. 8 and 9.

Figure 8:
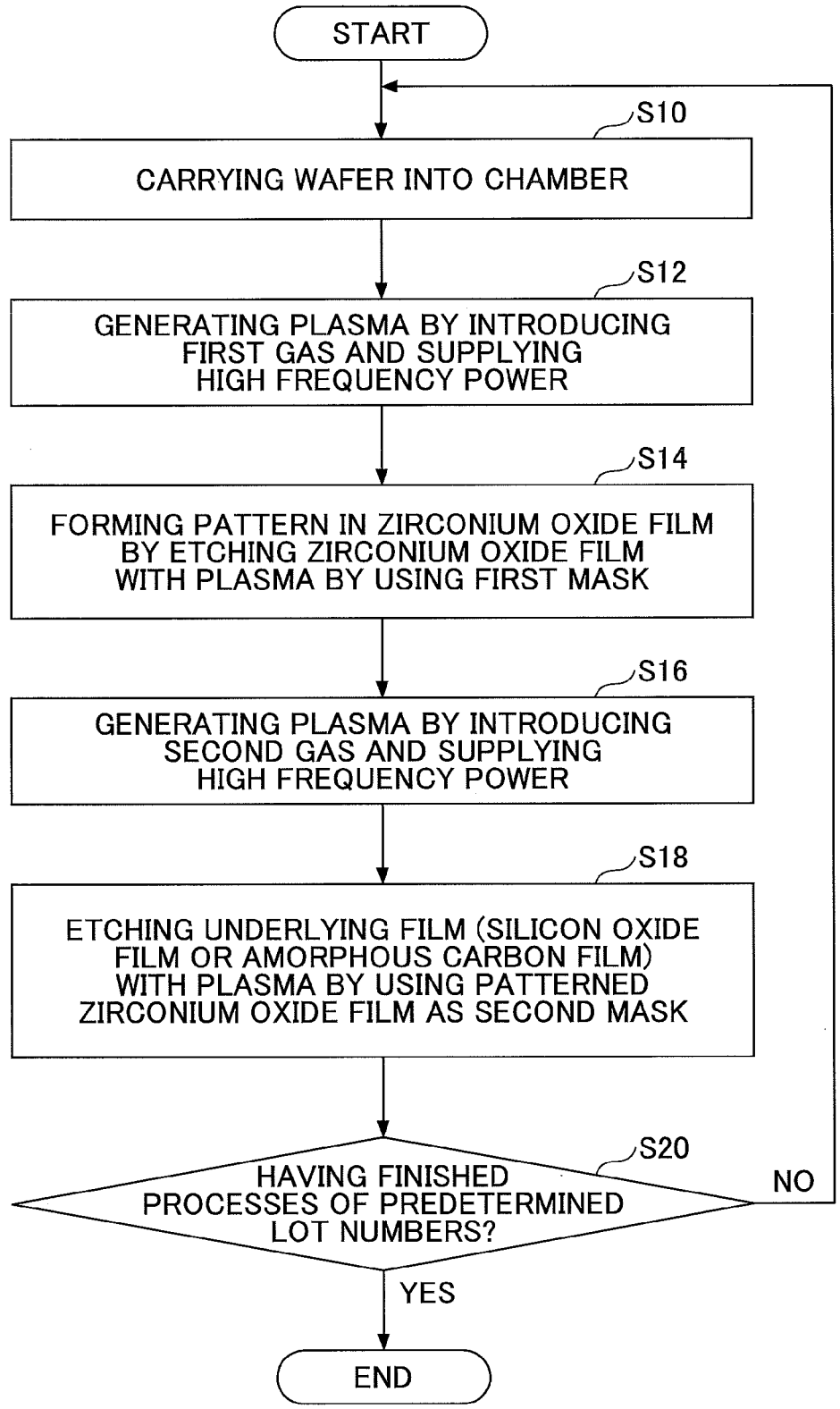
FIG. 8 is a flowchart illustrating an execution procedure of a plasma etching method according to an embodiment of the present invention.
Figure 9A:
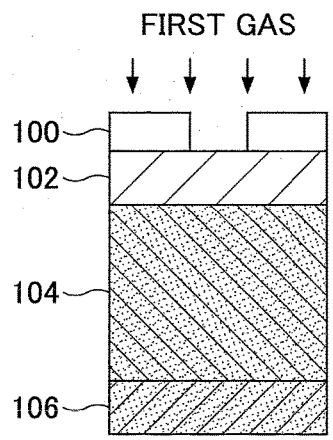
FIGS. 9A through 9C are diagrams illustrating an etching state of each film during a plasma etching according to an embodiment of the present invention.
Figure 9B:
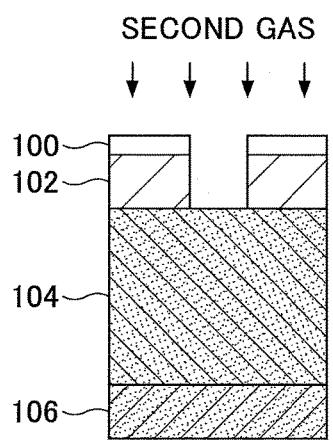
Figure 9C:
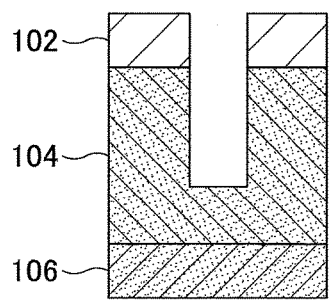

FIG. 8 is a flowchart illustrating a procedure of the plasma etching method according to the embodiment. FIGS. 9A through 9C are diagrams illustrating an etching state of each film during the plasma etching according to the embodiment.

The plasma etching method according to the embodiment is implemented by controlling the plasma etching apparatus 1 based on a recipe that specifies an execution procedure of the plasma etching method of the embodiment.

When a plasma etching process is started, a wafer W is carried into the chamber C (step S10). For example, as illustrated in FIG. 9A, a silicon film 106, a silicon oxide film 104 (or an amorphous carbon film), a zirconium oxide film 102, and a first mask 100 are stacked on the wafer to be carried into the chamber C in this order from the bottom. The first mask 100 is, for example, a photoresist film in which a desired pattern is formed.

Next, a first gas is introduced into the chamber C, and the first high frequency power source 5 supplies high frequency power for plasma generation, thereby generating plasma (step S12). Boron trichloride ($BCl_3$) and hydrogen ($H_2$) are cited as examples of the first gas. Here, the second high frequency power source 6 supplies high frequency power for bias.

Next, the zirconium oxide film is etched with the plasma generated from the first gas by using the first mask (step S14). This causes a desired pattern to be formed into the zirconium oxide film. For example, as illustrated in FIG. 9B, the zirconium oxide film 102 goes into a state of having the pattern formed therein.

Subsequently, a second gas is introduced into the chamber C, and the first high power source 5 supplies high frequency power for plasma generation, thereby generating plasma (step S16).

$C_4F_6$, $C_4F_8$, $O_2$, Ar, $NF_3$, $CF_4$, and $SF_6$ are cited as examples of the second gas when the target film to be etched is the silicon oxide film. When the target film to be etched is an organic film, HE3r, $CO_2$, He, $N_2$, $H_2$, $O_2$, Ar, COS, $Cl_2$, $CF_4$, $CHF_3$, and $SF_6$ are cited as examples of the second gas.

Next, the silicon oxide film 104 is etched with plasma generated from the second gas by using the patterned zirconium oxide film as a second mask (S18). This causes, for example, as illustrated in FIG. 9C, the silicon oxide film 104 (or amorphous carbon film) is etched into a desired pattern.

Subsequently, whether to have finished a predetermined number of lots of the wafer processes is determined (S20). When determining that the predetermined number of lots of the wafer processes have not finished, the process return to step S10, where a wafer W is carried into the chamber C, and processes of steps S12 through S20 are repeated. When it is determined that the predetermined number of lots of the wafer processes as step S20, the process flow finishes.

As discussed above, the method of performing a dry etching on the underlying layer by using the zirconium oxide film as the mask has been described. According to the plasma etching method of the embodiment, a preferable plasma etching can be performed by using the zirconium oxide film having the preferable selectivity to the silicon oxide film 104 or the amorphous carbon film.

[Cleaning Method]

In the pattern forming process (plasma etching) illustrated in FIG. 9A and the plasma etching process illustrated in FIG. 9B, the zirconium oxide film is etched. This causes a zirconium oxide containing substance to attach to the inside of the chamber C. A conditional change over time in the chamber C due to the attachment of the zirconium oxide film becomes a factor that causes a process shift.

Therefore, in a cleaning method according to an embodiment, the zirconium-oxide-containing substance attached to the inside of the chamber C is removed by a using gas containing the first gas (e.g., boron trichloride ($BCl_3$) and hydrogen ($H_2$)).

Figure 10:
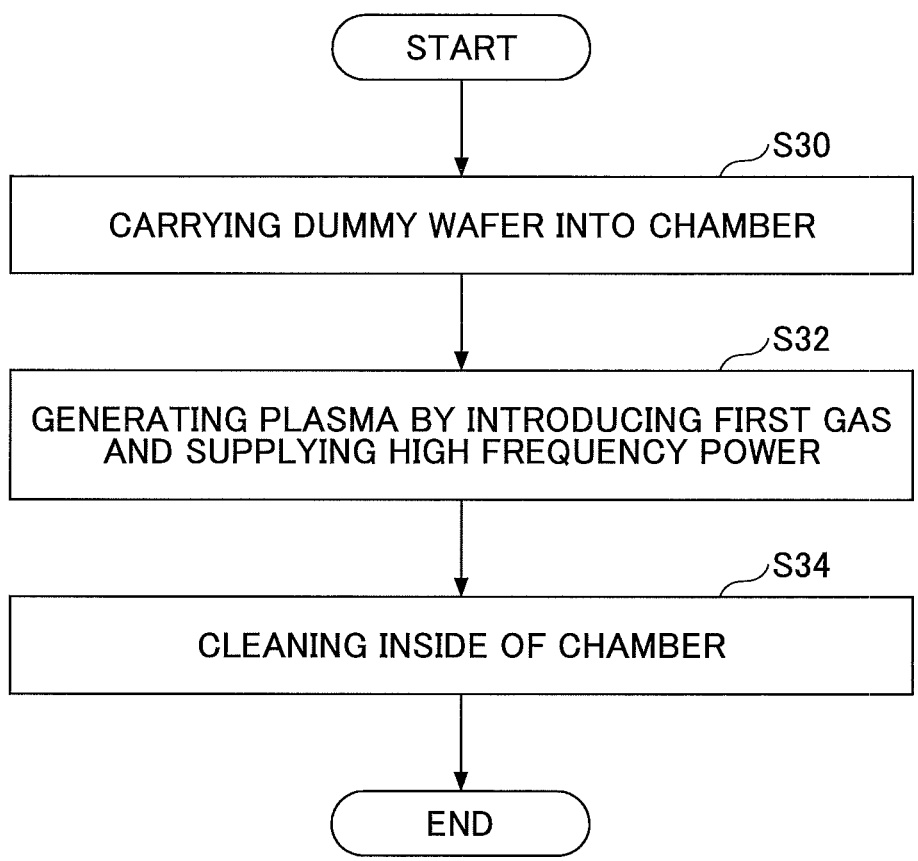
FIG. 10 is a flowchart for performing a cleaning process according to an embodiment of the present invention.

FIG. 10 is a flowchart illustrating an execution procedure of the cleaning method according to the embodiment. When a plasma etching process is started, a dummy wafer is carried into the chamber C (step S30). However, the dummy wafer is not necessarily carried into the chamber C. In this case, a WLDC (Waferless Dry Cleaning) is performed instead.

Next, the first gas is introduced into the chamber C, and the first high frequency power source 5 supplies high frequency power for plasma generation, thereby generating plasma (S32). The plasma generated from the first gas causes the zirconium-oxide-containing substance attached to the inside of the chamber C to be removed, thereby cleaning the inside of the chamber C (S34). Thus, by performing the plasma etching on the zirconium oxide film, the zirconium-oxide-containing substance attached to the inner wall of the chamber C can be removed, and the inside of the chamber C can be cleaned.

Here, process conditions used in the above cleaning is the following.

Pressure: 20 mT;
First High Frequency Power: 500 W;
Pedestal Temperature: 30 degrees C.; and
Etching Time: 30 seconds.

As described above, according to the plasma etching method of the embodiments, a zirconium film or a high-k film containing the zirconium oxide film can be etched by using plasma so that selectivity to a specific target film to be etched, such as a silicon oxide film or an amorphous carbon film, becomes more than or equal to one. Moreover, a pattern can be formed in the zirconium oxide film or the amorphous carbon film so that the selectivity to a specific target film to be etched such as the silicon oxide film or the amorphous carbon film becomes greater than or equal to one. Furthermore, the inside of the chamber C after etching the zirconium oxide film or the high-k film by using the plasma can be preferably cleaned so that the selectivity to a specific target film to be etched such as the silicon oxide film or the amorphous carbon film becomes greater than or equal to one.

Thus, according to the embodiments of the present invention, a film including a film having preferable selectivity to a specific target film to be etched can be etched by using plasma.

Although the plasma etching method, the pattern forming method and the cleaning method have been described above according to the embodiments, the plasma etching method, the pattern forming method and the cleaning method of the present invention are not limited to the embodiments. Various modifications and improvements can be made without departing from the scope of the invention. Moreover, the embodiments and modifications can be combined as long as they are not contradictory to each other.

A plasma generating unit used in a plasma etching apparatus to perform the plasma etching method, the pattern forming method and the cleaning method according to the embodiments of the present invention is not limited to the plasma etching apparatus (capacitively coupled plasma (CCP) generation unit) described in the embodiments. The described embodiments and aspect of the invention may also be applied with an inductively coupled plasma (ICP) generation unit, a helicon wave excited plasma (HWP) generation unit, a microwave-excited surface-wave plasma generation unit including microwave plasma generated from a radial line slot antenna or SPA (slot plane antenna) plasma, an electron cyclotron resonance plasma (ECR) generation unit, a remote plasma generation unit using the above generation units and the like.

A substrate to be processed in the plasma processing apparatus of the present invention is not limited to the wafer, but for example, may be a large substrate for a flat panel display, a substrate for an EL (electroluminescence) device or a solar cell.

What is claimed is:

1. A plasma etching method comprising:
   etching a first film that contains zirconium oxide using a mask to form a pattern in the first film with a first plasma generated from a first gas that consists of boron trichloride, hydrogen and a noble gas by supplying plasma generation radio frequency power to a first electrode while supplying bias radio frequency power to a second electrode, the mask being made of any one of a silicon oxide film, an amorphous carbon film and a spin-on carbon film, a flow rate of boron trichloride being lower than a flow rate of hydrogen;
   etching an underlying film of a silicon dioxide or an amorphous carbon formed under the first film with a second plasma generated from a second gas that is different from the first gas by supplying plasma generation radio frequency power to the first electrode while stopping the supply of bias radio frequency power to the second electrode, an etching selectivity of the film to the underlying film being greater than or equal to 1; and cleaning an inner wall of a chamber by etching a second film that contains zirconium oxide and is deposited on the inner wall of the chamber with the first plasma generated from the first gas that consists of boron trichloride, hydrogen and the noble gas by supplying plasma generation radio frequency power to the first electrode while stopping the supply of bias radio frequency power to the second electrode, the first film and the second film being a same type of film.

2. The plasma etching method as claimed in claim 1, further comprising:
forming the silicon oxide film or the amorphous carbon film of the underlying film formed under the film into the pattern formed in the film with the second plasma by using the patterned film as a second mask.

3. The plasma etching method as claimed in claim 1, further comprising:
carrying a substrate having the underling film and the first film formed thereon into the chamber before the step of etching the first film; and
carrying the substrate out of the chamber between the steps of etching the underlying film and cleaning the inner wall of the chamber.

4. The plasma etching method as claimed in claim 3, further comprising:
carrying a second dummy substrate between the steps of carrying the substrate out of the chamber and cleaning the inner wall of the chamber.

5. A pattern forming method comprising:
forming a pattern in a film that contains zirconium oxide by performing the plasma etching method as claimed in claim 1 so as to etch the film that contains zirconium oxide by using the mask.

6. A plasma etching method comprising:
etching a first film that contains zirconium oxide formed on a substrate disposed on a pedestal using a mask to form a pattern in the first film with a first plasma generated from a first gas that consists of boron trichloride and hydrogen by supplying plasma generation radio frequency power to a first electrode provided above or in the pedestal while supplying bias radio frequency power to a second electrode provided in the pedestal, the mask being made of any one of a silicon oxide film, an amorphous carbon film and a spin-on carbon film, a flow rate of boron trichloride being lower than a flow rate of hydrogen; and
etching an underlying film of a silicon dioxide or an amorphous carbon formed under the first film with a second plasma generated from a second gas that is different from the first gas by supplying plasma generation radio frequency power to the first electrode while stopping the supply of bias radio frequency power to the second electrode, an etching selectivity of the film to the underlying film being greater than or equal to 1;
cleaning an inner wall of a chamber by etching a second film that contains zirconium oxide and is deposited on the inner wall of the chamber with the first plasma generated from the first gas that consists of boron trichloride, hydrogen and the noble gas by supplying plasma generation radio frequency power to the first electrode while stopping the supply of bias radio frequency power to the second electrode, the first film and the second film being a same type of film.

7. The plasma etching method as claimed in claim 6, further comprising:
forming the silicon oxide film or the amorphous carbon film of the underlying film formed under the film into the pattern formed in the film with the second plasma by using the patterned film as a second mask.

8. The plasma etching method as claimed in claim 6, further comprising:
carrying a substrate having the underling film and the first film formed thereon into the chamber before the step of etching the first film; and
carrying the substrate out of the chamber between the steps of etching the underlying film and cleaning the inner wall of the chamber.

9. The plasma etching method as claimed in claim 8, further comprising:
carrying a second dummy substrate between the steps of carrying the substrate out of the chamber and cleaning the inner wall of the chamber.

10. A pattern forming method comprising:
forming a pattern in a film that contains zirconium oxide by performing the plasma etching method as claimed in claim 6 so as to etch the film that contains zirconium oxide by using the mask.

11. A plasma etching method comprising:
forming a mask pattern in a first film that contains zirconium oxide by etching using a mask to form the mask pattern in the first film with a first plasma generated from a first gas that consists of boron trichloride, hydrogen and a noble gas by supplying plasma generation radio frequency power to a first electrode while supplying bias radio frequency power to a second electrode, the plasma generation radio frequency power being higher than the bias radio frequency power, a flow rate of boron trichloride being lower than a flow rate of hydrogen; and
patterning an underlying film of a silicon dioxide or an amorphous carbon formed under the first film with a second plasma generated from a second gas using the mask pattern by supplying plasma generation radio frequency power to the first electrode while stopping the supply of bias radio frequency power to the second electrode, an etching selectivity of the film to the underlying film is greater than or equal to 1;
cleaning an inner wall of a chamber by etching a second film that contains zirconium oxide and is deposited on the inner wall of the chamber with the first plasma generated from the first gas that consists of boron trichloride, hydrogen and the noble gas by supplying plasma generation radio frequency power to the first electrode while stopping the supply of bias radio frequency power to the second electrode, the first film and the second film being a same type of film.

12. The plasma etching method as claimed in claim 11, further comprising:
carrying a substrate having the underling film and the first film formed thereon into the chamber before the step of etching the first film; and
carrying the substrate out of the chamber between the steps of etching the underlying film and cleaning the inner wall of the chamber.

13. The plasma etching method as claimed in claim 12, further comprising:
carrying a second dummy substrate between the steps of carrying the substrate out of the chamber and cleaning the inner wall of the chamber.

* * * * *